United States Patent [19]

Meddles

[11] Patent Number: 4,642,419
[45] Date of Patent: Feb. 10, 1987

[54] FOUR-LEADED DUAL IN-LINE PACKAGE MODULE FOR SEMICONDUCTOR DEVICES

[75] Inventor: Dennis Meddles, Lawndale, Calif.

[73] Assignee: International Rectifier Corporation, Los Angeles, Calif.

[21] Appl. No.: 251,268

[22] Filed: Apr. 6, 1981

[51] Int. Cl.[4] .............................................. H01L 23/28
[52] U.S. Cl. .................................. 174/52 FP; 357/74
[58] Field of Search .......... 174/52 FP, 52 PE, 16 HS; 357/74, 81, 72

[56] References Cited

U.S. PATENT DOCUMENTS

| | | | |
|---|---|---|---|
| 3,522,490 | 8/1970 | Kauffman | 357/72 X |
| 3,668,299 | 6/1972 | McNeal | 174/52 FP X |
| 3,839,660 | 10/1974 | Stryker | 174/52 PE X |
| 4,203,792 | 5/1980 | Thompson | 357/72 X |

Primary Examiner—Arthur T. Grimley
Assistant Examiner—D. A. Tone
Attorney, Agent, or Firm—Ostrolenk, Faber, Gerb & Soffen

[57] ABSTRACT

A four-leaded dual in-line package is disclosed in which a rectangular insulation housing carries a semiconductor device therein which is connected to flat lead frame elements which extend out through the opposite sides of the insulation housing and define two pairs of in-line leads on opposite respective sides of the insulation housing. Two leads on one side of the package are insulated from one another and the two leads on the other side of the package are joined together. The two leads which are joined together extend from a flat heat sink frame section which carries a semiconductor chip in good heat-conduction relationship. The device within the package is disclosed as a three-electrode MOS transistor. Other devices can be contained within the housing. The insulation housing surrounding the in-line leads extends beyond the centers of the leads by a distance equal to one-half of the center-to-center spacing between leads. The entire package is a module which can be stacked end to end with identical modules, with the adjacent leads of two modules having the same center-to-center spacing from one another as the center-to-center spacing between the two leads on each side of each module. Thus, individual modules can be stacked together, for example, to form a sixteen-lead quad. The extending leads of the single or stacked modules can plug into a standard DIP socket.

12 Claims, 7 Drawing Figures

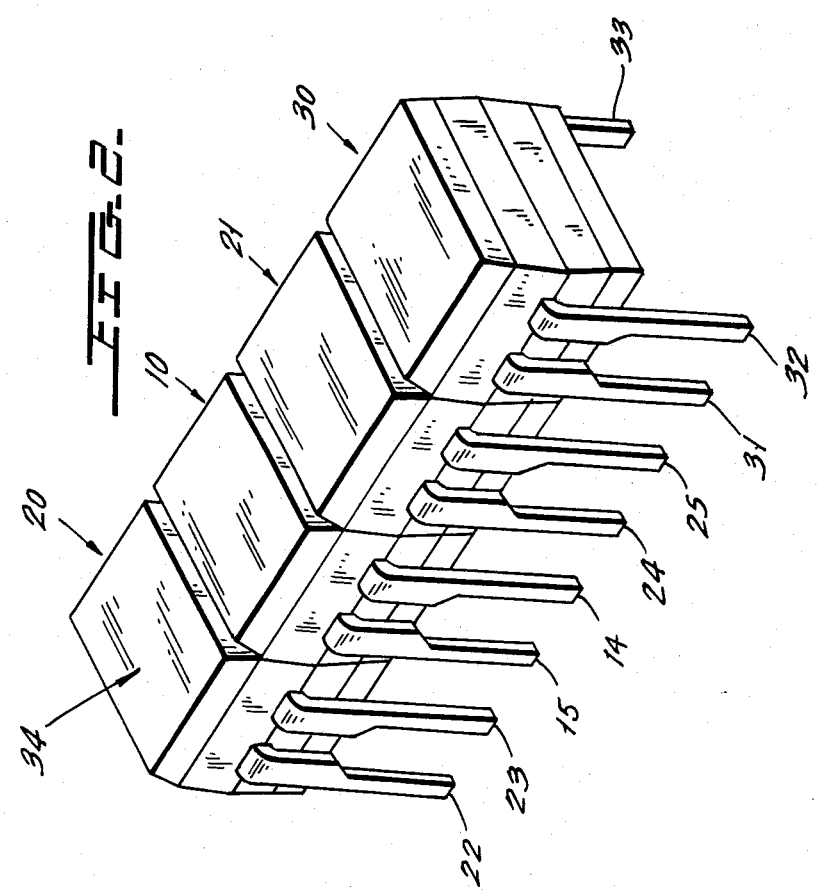
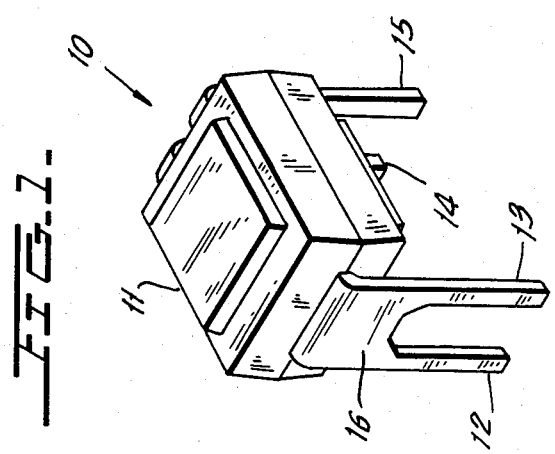

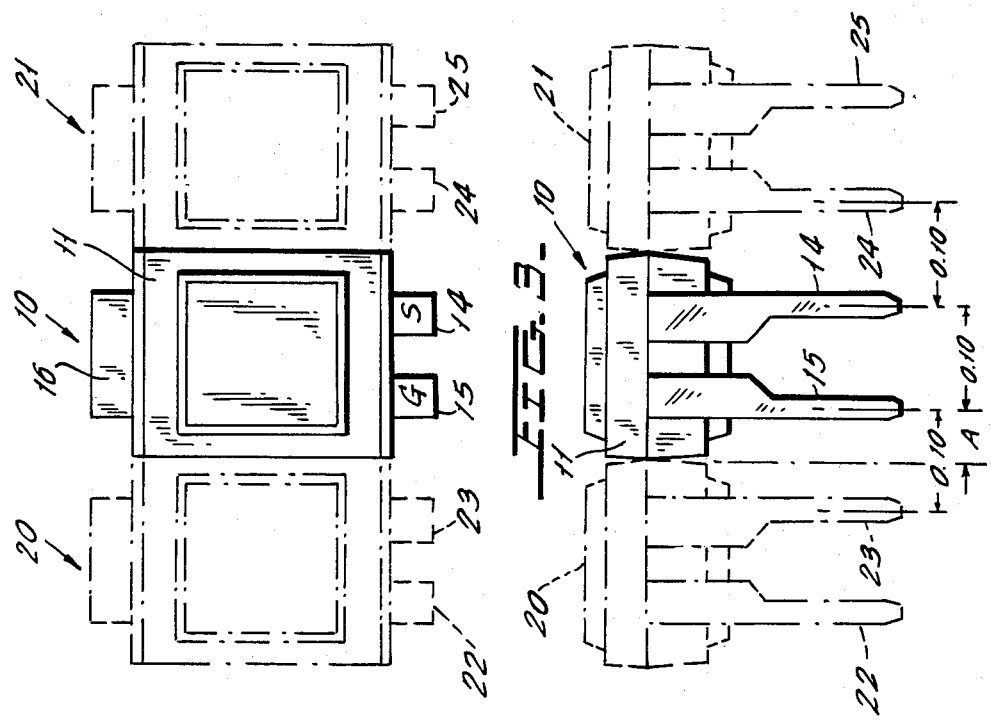
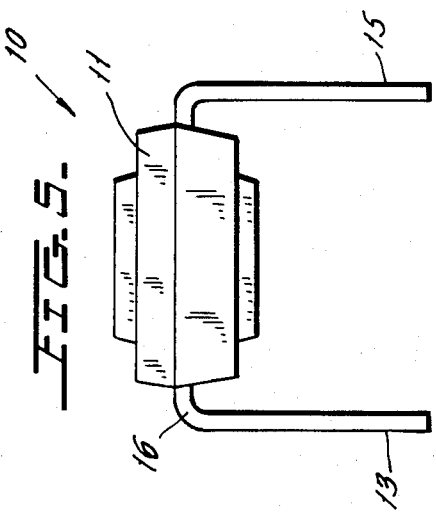

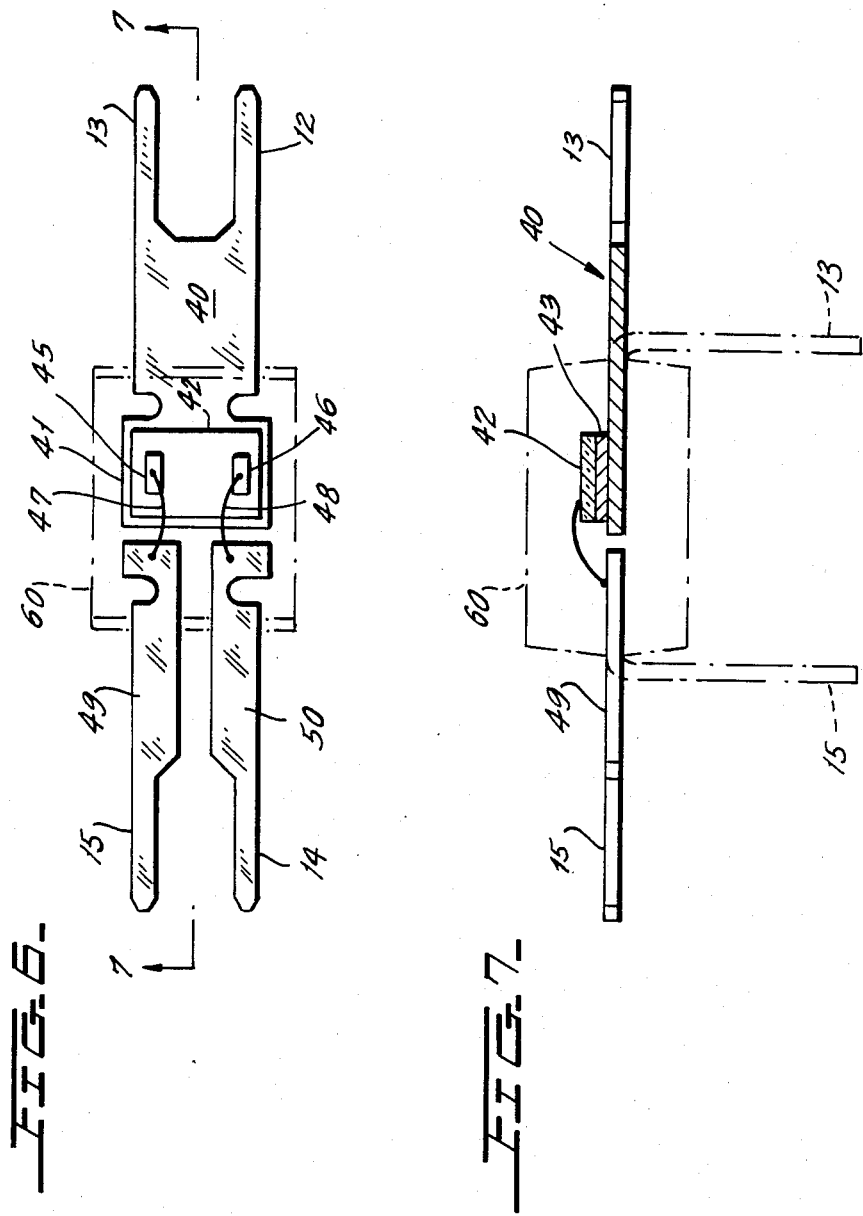

FOUR-LEADED DUAL IN-LINE PACKAGE MODULE FOR SEMICONDUCTOR DEVICES

BACKGROUND OF THE INVENTION

This invention relates to a novel semiconductor device housing, and more specifically relates to a novel four-leaded dual in-line housing having a configuration which permits the mounting of semiconductor devices in the interior of a molded housing while providing an effective heat sink for the device and which permits the stacking of modules with identical spacing between the leads on each side of the stacked assembly.

Multiple lead dual in-line housings for semiconductor devices are well known. These housings consist of an insulation housing having parallel spaced sides from which leads extend. The leads on the respective opposite edges of the insulation housing are in line with one another and the number of leads which extend the housing length depends upon the nature of the device or devices housed. Standard dual in-line sockets receive the extending leads or prongs of the dual in-line housings in plug-in type connection and the leads can be soldered to the cooperating socket members.

The number of leads for a given package is determined by the nature of the device or devices within the package. Thus, a large number of different housings must be manufactured for diverse kinds of devices.

BRIEF DESCRIPTION OF THE INVENTION

In accordance with the present invention, a novel dual in-line housing structure is provided as a basic module which consists of a four-lead package. Two leads on one side are joined together and extend from a common conductive frame region which can serve as both a heat sink and first terminal device. Two separate leads extend from the other side of the housing and are electrically insulated from one another but are in line with the two leads on the opposite side of the housing. All of the lead elements are parts of a common lead frame.

The insulation housing enclosing the leads and the semiconductor device carried by the leads is such that it overlaps the centers of the leads by one-half their center-to-center separation. Consequently, housings can be joined end to end to automatically space the adjacent leads of each housing by a space identical to the spacing between the leads of the housing. Therefore, any number of housings can be stacked together to form dual in-line packages of any desired number of leads which are identically spaced. This eliminates the need for manufacture of a different number of housings depending upon the number of devices to be contained within the overall assembly and permits the stacking of any desired number of modules. For example, a sixteen-lead quad unit can be made of four identical, four-leaded dual in-line packages.

Any desired device can be housed within the package. As an example, the device contained within the package can be a MOSFET device having a chip size of about 90 mils by 140 mils, and a structure of the type disclosed in copending application Ser. No. 178,689, filed Aug. 18, 1980, in the names of Alexander Lidow and Thomas Herman. This device generally consists of a thin chip of silicon having a drain connection on its bottom surface and insulated source and gate connections on its upper surface. With such an arrangement, the drain electrode of the chip would be appropriately soldered to a main lead frame section having two connected leads extending therefrom. The source and gate connection regions of the chip would then be suitably wire-bonded to two other legs of the lead frame which are separated and insulated from one another.

After solder-down of the chip and the connection of its source and gate to the leads of the lead frame, the chip is encapsulated in a rectangular insulation housing. The housing ends extend beyond the centers of the leads by a distance equal to one-half the lead spacing. Thus, when housings are stacked end to end, all leads will have the same spacing along the length of the housings. Adjacent housings can be permanently connected together as by cementing, or can be held together through their connection in a common header, carrier or printed circuit board.

BRIEF DESCRIPTION OF THE DRAWINGS

FIG. 1 is a perspective view of the four-lead dual in-line module of the present invention.

FIG. 2 is a perspective view of four of the modules of FIG. 1 secured to one another in accordance with the present invention to define a sixteen-lead quad.

FIG. 3 is an elevational view of the assembly of FIG. 1 with adjacent modules shown in phantom lines.

FIG. 4 is a top view of FIG. 3.

FIG. 5 is an end view of FIG. 3.

FIG. 6 is a plan view of the lead frame elements of the leads defining a four-lead module with the insulation housing shown in dotted lines.

FIG. 7 is a cross-sectional view of FIG. 6 taken across the section line 7—7 in FIG. 6 with the housing and bent leads shown in dotted lines.

DETAILED DESCRIPTION OF THE INVENTION

A novel modular housing 10 is provided for a semiconductor device as shown in FIG. 1. The module 10 consists of an insulation housing 11 having a total of four leads, with leads 12 and 13 extending from one side thereof, and leads 14 and 15 extending from the other side thereof, which are in-line with leads 12 and 13, respectively. The housing 11 may be a conventional housing formed by well-known transfer-molding techniques or formed in any other desired manner. Leads 12 and 13 are connected together and extend from a common region 16 which extends out of the housing 11. Leads 14 and 15 are electrically separated from one another and are insulated from one another as they leave the housing 11. Leads 12-13, 14 and 15 are three respective severed parts of a common lead frame as will be later described.

In a typical embodiment of the invention, leads 12 through 15 have a size and spacing adapted to plug into a conventional header socket, with the leads 12 and 13 and leads 14 and 15, respectively, spaced from one another by about 0.100 inch center to center. The spacing of the ends of leads 13 and 15, when bent as seen in FIG. 5 so that they are parallel to one another, is about 0.300 inch. The height of insulation body 11 may be approximately 0.2 inch. The total width of the insulation housing 11 from end to end is approximately 0.198 inch, with the leads 14 and 15 and the leads 12 and 13 being symmetrically disposed across this width. Consequently, the distance A in FIG. 3 is about one-half the spacing between leads 14 and 15 which is approximately 0.050 inch. As a result of this novel geometry, when identical modules are stacked end to end, as shown in phantom view in FIGS. 3 and 4 for the modules 20 and 21, all adjacent leads including the leads 22 and 23 of module 20, leads 24 and 25 of module 21 and leads 15 and 14 of module 10 will be spaced by an identical distance. The individual modules may be cemented or otherwise secured together to form a dual or quad package which will fit exactly into a standard DIP socket.

A sixteen-lead quad assembly 34 consisting of four assemblies held end to end in the form of a housing is shown in FIG. 2 for the case of assemblies 20, 10 and 21 and a fourth assembly 30. It will be noted that the fourth assembly 30 has insulated leads 31 and 32 on one side and lead 33 (in-line with 32) and a fourth lead which is in-line with lead 31 but is not visible in FIG. 2. The leads which are in-line with leads 22, 23, 14, 15, 24, 25, 31 and 32 and which are on the opposite edge of the quad arrangement in FIG. 2 will be joined together, within each module element, as shown for module 10 in FIG. 1.

FIGS. 6 and 7 illustrate one possible lead frame structure (after severing from a frame body) for a single module. Referring to FIG. 7, the lead frame elements consist of coplanar members which are stamped from a common lead frame in accordance with standard practice. The lead frame can be a suitably stamped copper sheet having a thickness of about 10 to 15 mils. While the members are still joined within their main lead frame, an enlarged area heat sink element 40 having an enlarged head region 41 receives the semiconductor chip 42 which is to be mounted within the housing.

The chip 42 is shown in FIG. 7 to be fixed to the lead frame element 40 as by a suitable solder wafer 43. Any desired solder-down technique can be used to secure the chip 42 to the frame 40. As pointed out previously, the chip 42 may be a vertical conduction-type MOSFET and its bottom surface, which is received by the solder wafer 43, may be a drain electrode.

The upper surface of chip 42 has a gate pad 45 and a source pad 46. These pads are electrically connected to thin flexible aluminum wires 47 and 48, respectively, which are appropriately bonded to the pads 45 and 46 and then have their other ends suitably connected to insulated lead members 49 and 50 of the lead frame assembly.

The lead frame elements are then transfer-molded within a molding which will have its outline illustrated by the dotted line 60 in FIGS. 6 and 7. The individual lead frame elements 40, 49 and 50 are then severed from the lead frame and the individually housed modules are separated from one another. The outwardly extending lead frame elements may then be bent downwardly as shown for the four leads 12, 13, 14 and 15 of the module of FIG. 1.

Although the present invention has been described in connection with a preferred embodiment thereof, many variations and modifications will now become apparent to those skilled in the art. It is preferred, therefore, that the present invention be limited not by the specific disclosure herein, but only by the appended claims.

What is claimed is:

1. A four-leaded dual in-line housing assembly for a semiconductor device comprising:
    a rectangular molded insulation housing having a pair of generally flat, spaced, parallel sides and a pair of generally flat, spaced, parallel ends perpendicular to said sides, and generally flat, parallel top and bottom surfaces:
    a flat semiconductor chip disposed in the interior of said insulation housing:
    a first pair of first and second leads connected to said chip and extending from within said housing and out of the first of said pair of sides; said first pair of first and second leads having a fixed spacing at their outer ends and being separate and insulated from one another for their full length; the portions of said first pair of first and second leads within said housing lying in a plane parallel to the plane of at least one of said top and bottom surfaces and being symmetrically disposed along the width of said first of said pair of sides, the center of said first lead of said first pair of leads being located at ¼ the distance across the width of said first side and the center of said second lead of said first pair of leads being located at ¾'s the distance across the width of said first side;
    a second pair of first and second leads connected to said chip and extending from within said housing and out of the second of said pair of sides; each of said second pair of leads being disposed in-line with respective ones of said first pair of leads; each of said first and second leads of said second pair of leads being joined together at least in the region interior of said housing at a common enlarged area lead frame; said enlarged area lead frame being disposed in a plane parallel to the plane of said first pair of leads.

2. The housing assembly of claim 1 wherein said chip is heat conductively mounted on said common enlarged area.

3. The housing assembly of claim 2, wherein said first and second pairs of leads are bent generally parallel to said first and second sides respectively in the region exterior of said housing.

4. The housing assembly of claim 3, wherein said first and second pairs of leads are flat, parallel, elements formed from a common lead frame.

5. The housing assembly of claim 1, wherein said first and second pairs of leads are bent generally parallel to said first and second sides respectively in the region exterior of said housing.

6. The housing assembly of claim 1, wherein said first and second pairs of leads are flat, parallel, elements formed from a common lead frame.

7. A four-leaded dual in-line housing assembly for a semiconductor device comprising:
    a rectangular molded insulation housing having a pair of generally flat, spaced, parallel sides and a pair of generally flat, spaced, parallel ends perpendicular to said sides, and generally flat, parallel top and bottom surfaces;
    a flat semiconductor chip disposed in the interior of said insulation housing;
    a first pair of first and second leads connected to said chip and extending from within said housing and out of the first of said pair of sides; said first pair of first and second leads having a fixed spacing at their outer ends and being separate and insulated from one another for their full length; the portions of said first pair of first and second leads within said housing lying in a plane parallel to the plane of at least one of said top and bottom surfaces and being symmetrically disposed along the width of said first of said pair of sides;
    a second pair of first and second leads connected to said chip and extending from within said housing and out of the second of said pair of sides; each of said second pair of leads being disposed in-line with respective ones of said first pair of leads; each of said first and second leads of said second pair of leads being joined together at least in the region interior of said housing at a common enlarged area lead frame; said enlarged area lead frame being disposed in a plane parallel to the plane of said first pair of leads.

8. The housing assembly of claim 7 wherein said chip is heat conductively mounted on said common enlarged area.

9. The housing assembly of claim 8, wherein said first and second pairs of leads are bent generally parallel to said first and second sides respectively in the region exterior of said housing.

10. The housing assembly of claim 9, wherein said first and second pairs of leads are flat, parallel, elements formed from a common lead frame.

11. The housing assembly of claim 7, wherein said first and second pairs of leads are bent generally parallel to said first and second sides respectively in the region exterior of said housing.

12. The housing assembly of claim 7, wherein said first and second pairs of leads are flat, parallel, elements formed from a common lead frame.

* * * * *